(12) United States Patent
Otsuka et al.

(10) Patent No.: US 7,808,007 B2
(45) Date of Patent: Oct. 5, 2010

(54) OPTICAL SEMICONDUCTOR DEVICE

(75) Inventors: Kazuaki Otsuka, Kanagawa-ken (JP); Toshihiro Kuroki, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 163 days.

(21) Appl. No.: 12/128,783

(22) Filed: May 29, 2008

(65) Prior Publication Data
US 2009/0008666 A1    Jan. 8, 2009

(30) Foreign Application Priority Data
May 29, 2007  (JP)  ............................ 2007-142663

(51) Int. Cl.
*H01L 29/26*    (2006.01)
(52) U.S. Cl. ...................... 257/80; 257/81; 257/84; 257/98; 257/E31.129
(58) Field of Classification Search .................. 428/690, 428/691; 257/E31.129, E33.061, 79, 80, 257/81, 84, 98, 99, 100; 362/84, 800
See application file for complete search history.

(56) References Cited
U.S. PATENT DOCUMENTS
7,332,746 B1 * 2/2008 Takahashi et al. .............. 257/98

| | | | |
|---|---|---|---|
| 2006/0193121 A1 * | 8/2006 | Kamoshita | .................... 362/84 |
| 2006/0226759 A1 | 10/2006 | Masuda et al. | |
| 2007/0090381 A1 | 4/2007 | Otsuka et al. | |
| 2007/0194709 A1 * | 8/2007 | Kato et al. | .................... 313/512 |
| 2009/0008666 A1 * | 1/2009 | Otsuka et al. | .................... 257/98 |

FOREIGN PATENT DOCUMENTS
JP    2001-210874    8/2001
JP    2004-179644    6/2004

* cited by examiner

*Primary Examiner*—Evan Pert
*Assistant Examiner*—Scott R Wilson
(74) *Attorney, Agent, or Firm*—Turocy & Watson, LLP

(57) ABSTRACT

A semiconductor light-emitting element is disposed in a depression of a container. A first fluorescent material layer is located in the depression. At least a portion of the first fluorescent material layer is provided between the opening of the depression and the semiconductor light-emitting element. A second fluorescent material layer having first and second portions is disposed in the depression. The first portion is provided between the bottom of the depression and the semiconductor light-emitting element. The second portion is provided between the side surface of the depression and the semiconductor light-emitting element. The first and second fluorescent material layers are excited by the light radiated from the semiconductor light-emitting element to emit a light having a first wavelength longer than the emission wavelength of the semiconductor light-emitting element and another light having a second wavelength longer than the first wavelength respectively.

20 Claims, 13 Drawing Sheets

OPTICAL SEMICONDUCTOR DEVICE

CROSS REFERENCE TO RELATED APPLICATION

This application is based upon and claims the benefit of priority from the prior Japanese Patent Application No. 2007-142663, filed on May 29, 2007, the entire contents of which are incorporated herein by reference.

FIELD OF THE INVENTION

The present invention relates to an optical semiconductor device which is provided with a semiconductor light-emitting element and a fluorescent material, and more specifically an optical semiconductor device having a semiconductor light-emitting element to radiate light to a fluorescent material so that the fluorescent material can emit light.

DESCRIPTION OF THE BACKGROUND

An optical semiconductor device, which is provided with a semiconductor light-emitting element and a fluorescent material, is known as a small-sized and low power-consuming illumination source. The semiconductor light-emitting element radiates light to the fluorescent material so that the fluorescent material emits white-grouped color-mixed light. Such a kind of optical semiconductor device is disclosed in Japanese Patent Application Publication No. 2004-179644 and Japanese Patent Application Publication No. 2001-210874, for example.

According to the optical semiconductor device disclosed in the former patent publication, first and second fluorescent material layers are stacked on a semiconductor light-emitting element. The second fluorescent material layer contains a fluorescent material which emits fluorescent light having a wavelength shorter than that of the fluorescent material contained in the first fluorescent material layer.

In the optical semiconductor device disclosed in the former patent publication, the first fluorescent material layer can efficiently emit light. It is because the first fluorescent material layer is directly excited by the light radiated from a semiconductor light-emitting element. However, the second fluorescent material layer can not always efficiently emit light. It is because the light radiated from the semiconductor light-emitting element includes a light beam which directly excites the second fluorescent material layer and a light beam which is reflected by the first fluorescent material. For this reason, the brightness of the second fluorescent material layer may be reduced by the same amount as the reflection amount caused by the first fluorescent material.

The optical semiconductor device disclosed in the latter patent publication is provided with a semiconductor light-emitting element having a light-emitting layer and first and second fluorescent material layers. The semiconductor light-emitting element is disposed and fixed in a depression of a container. The first and second fluorescent material layers contain first and second fluorescent materials respectively. The first and second fluorescent materials are uniformly dispersed in the first and second fluorescent material layers respectively. The first fluorescent material layer is formed on a lower surface of a substrate of a semiconductor light-emitting element. The second fluorescent material layer is formed on the entire surface of the semiconductor light-emitting element including a side surface of the same. The second fluorescent material layer has a light-emission wavelength different from that of the first fluorescent material layer. The light-emitting layer of the semiconductor light-emitting element is fully enveloped by the first and second fluorescent material layers.

According to the optical semiconductor device disclosed in the latter patent publication, brightness of a yellow color provided by the first fluorescent material layer is reduced, when the color of the light emitted from the first and fluorescent material layers are yellow and red respectively. It is because portion of the yellow light emitted from the first fluorescent material layer is absorbed in the second fluorescent material layer.

Furthermore, the inner surface of the depression of the container may be discolored and deteriorated by the yellow light which is emitted from the side surface of the semiconductor light-emitting element, when the colors of the lights emitted from the first and second fluorescent material layer are red and yellow respectively. The discoloration and deterioration of the container may reduce reliability of the optical semiconductor device.

SUMMARY OF THE INVENTION

An aspect of the present invention provides an optical semiconductor device, which comprises a container having a depression to reflect light, the depression having an opening, a bottom and a side surface, a semiconductor light-emitting element placed in the depression to emit light, a first fluorescent material layer located in the depression, at least a portion of the first fluorescent material layer being provided between the opening of the depression and the semiconductor light-emitting element, and the first fluorescent material layer being excited by the light emitted from the semiconductor light-emitting element to emit light having a first wavelength longer than an light-emission wavelength of the semiconductor light-emitting element, and a second fluorescent material layer having first and second portions, the first portion being provided between the bottom of the depression and the semiconductor light-emitting element and located in the depression, the second portion provided between the side surface of the depression and the semiconductor light-emitting element and located in the depression, the second fluorescent material layer being excited by the light emitted from the semiconductor light-emitting element to emit light having a second wavelength longer than the first wavelength.

Another aspect of the present invention provides an optical semiconductor device, which comprises a container having a depression to reflect light, the depression having an opening, a bottom and a side surface, a semiconductor light-emitting element placed in the depression to emit light, a first fluorescent material layer located in the depression, at least a portion of the first fluorescent material layer being provided between the opening of the depression and the semiconductor light-emitting element, and the first fluorescent material layer further being excited by the light emitted from the semiconductor light-emitting element to emit light having a first wavelength longer than a light-emission wavelength of the semiconductor light-emitting element, a second fluorescent material layer located in the depression and provided between the bottom of the depression and the semiconductor light-emitting element, the second fluorescent material layer being excited by the light emitted from the semiconductor light-emitting element to emit light having a second wavelength longer than the first wavelength, and a third fluorescent material layer located in the depression and provided between the side surface of the depression and the semiconductor light-emitting element, the third fluorescent material layer being excited by the light emitted from the semiconductor light-emitting element to emit light having the second wavelength longer than the first wavelength.

Still another aspect of the present invention provides an optical semiconductor device, which comprises a container having a first depression to reflect light, the first depression having an opening, a bottom and a side surface, a semiconductor light-emitting element placed in the first depression to emit light, the semiconductor light-emitting element having a substrate, and the substrate having a second depression, a first fluorescent material layer located in the first depression, at least a portion of the first fluorescent material layer being provided between the opening of the first depression and the semiconductor light-emitting element, and the first fluorescent material layer further being excited by the light emitted from the semiconductor light-emitting element to emit light having a first wavelength longer than an light-emission wavelength of the semiconductor light-emitting element, a second fluorescent material layer provided in the second depression of the substrate of the semiconductor light-emitting element, the second fluorescent material layer being excited by the light emitted from the semiconductor light-emitting element to emit light having a second wavelength longer than the first wavelength, and a third fluorescent material layer located in the first depression and provided between the side surface of the first depression and the semiconductor light-emitting element, the third fluorescent material layer being excited by the light emitted from the semiconductor light-emitting element to emit light having the second wavelength longer than the first wavelength.

DETAILED DESCRIPTION OF THE INVENTION

Figure 1:
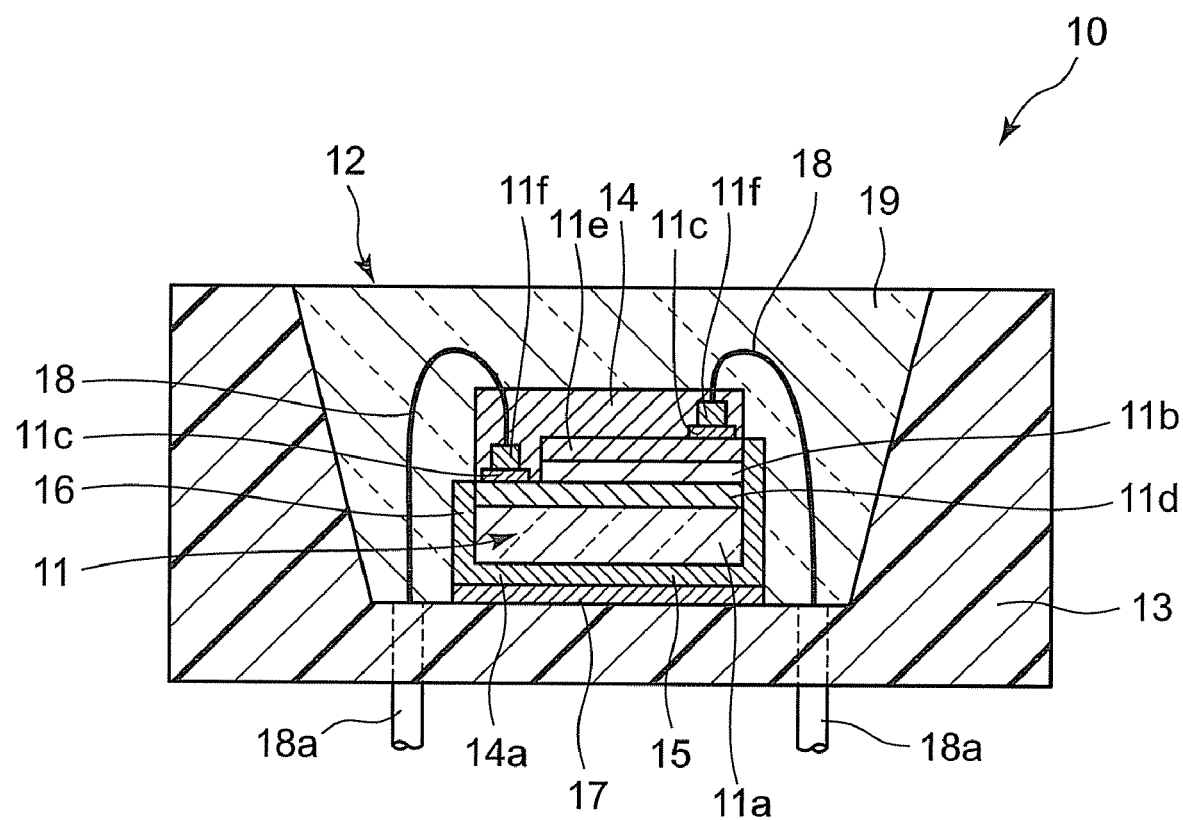
FIG. 1 is a cross-sectional view showing an optical semiconductor device according to a first embodiment of the present invention.

Embodiments of the present invention will be described with reference to the drawings. In the respective drawings, the same portion is indicated by the same reference numeral.

Figure 2A:
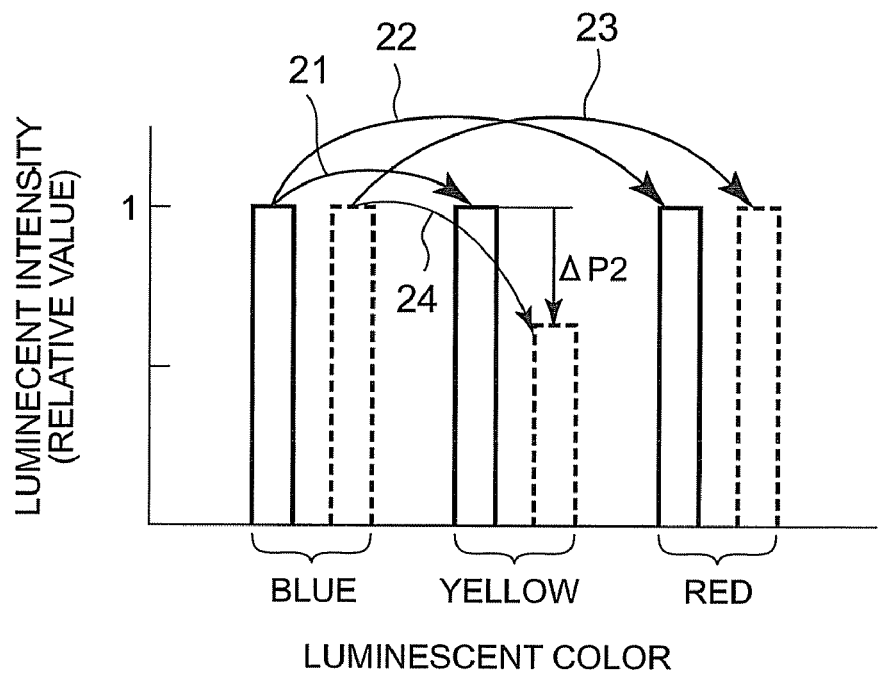
FIGS. 2A and 2B are graphs showing a luminescent intensity of the first embodiment in comparison with those of comparative examples 1 and 2 respectively.
Figure 2B:
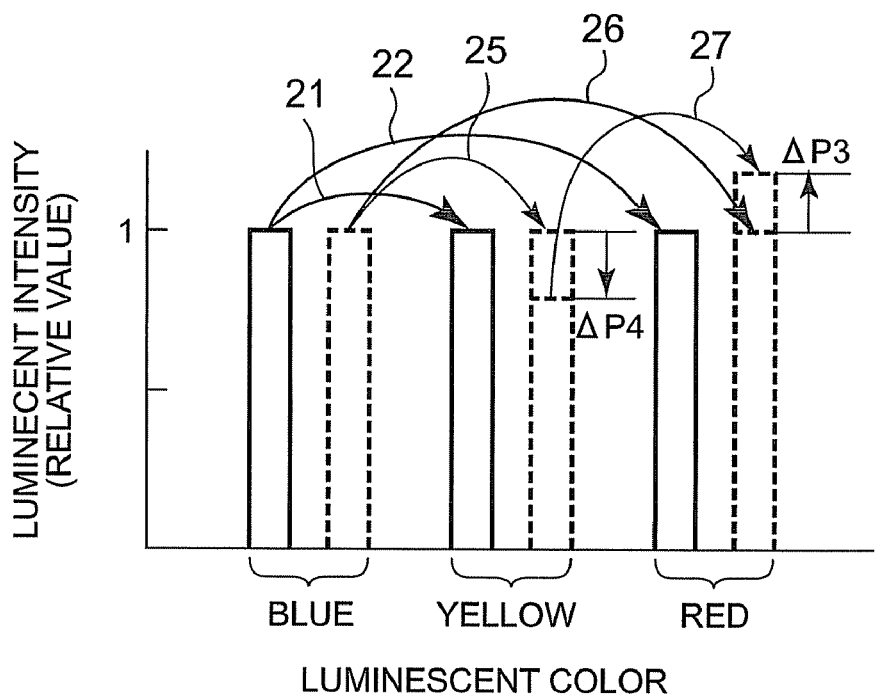
Figure 3:
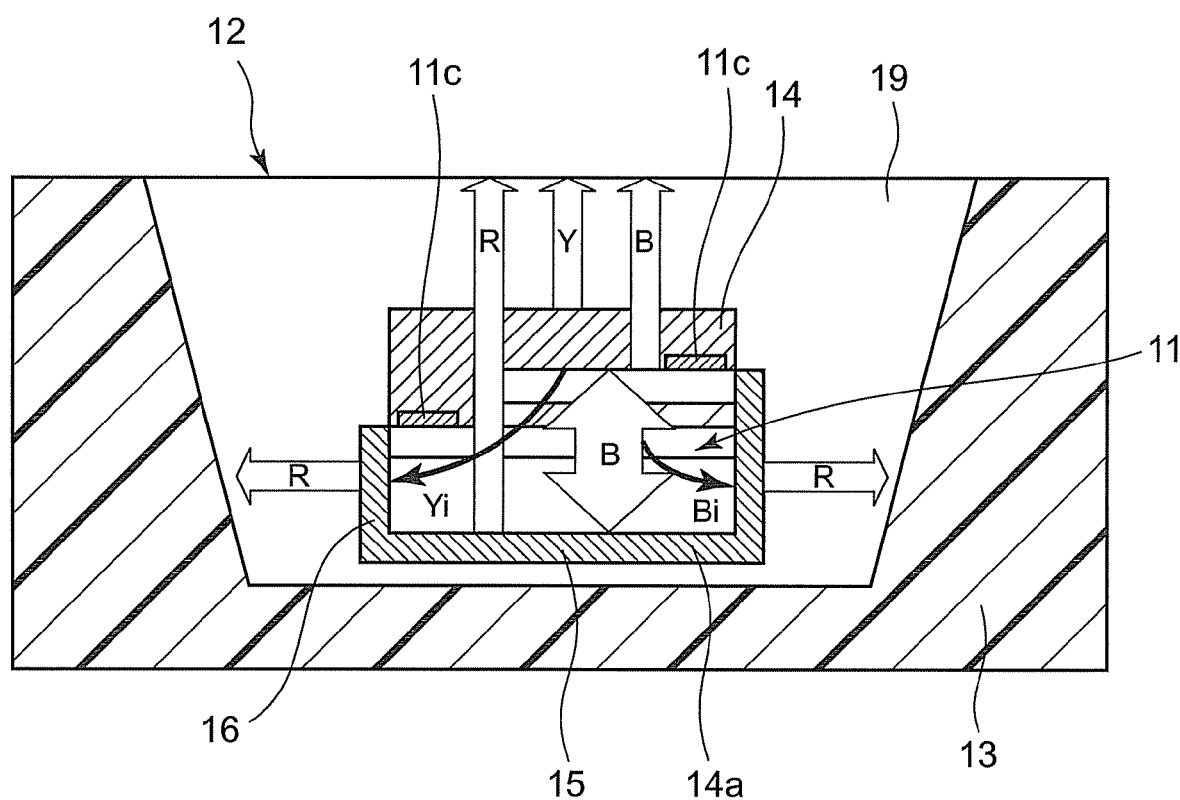
FIG. 3 is a view showing directions and intensities of a multiple number of lights produced by the optical semiconductor device according to the first embodiment.

A semiconductor device according to a first embodiment of the present invention will be described with reference to FIGS. 1 to 3 and FIGS. 4A to 4H. FIG. 1 is a cross-sectional view showing an optical semiconductor device according to the first embodiment. FIGS. 2A and 2B are graphs showing a relative value of luminescent intensity of the first embodiment in comparison with that of comparative examples 1 and 2 respectively. FIG. 3 is a view showing emitting directions of a multiple number of lights generated by the optical semiconductor device of FIG. 1. FIG. 3 is shown in an enlarged scale. FIGS. 4A to 4H are cross-sectional views showing examples of manufacturing steps of the optical semiconductor device according to the first embodiment respectively. In each of FIGS. 4A to 4H is shown in a reduced scale.

As shown in FIG. 1, an optical semiconductor device 10 of the first embodiment is provided with a semiconductor light-emitting element 11. The semiconductor light-emitting element 11 is disposed in a depression 12 of a container 13 having a rectangular solid shape. The depression 12 is located at the center of the container 13. The semiconductor light-emitting element 11 emits blue light having an emission wavelength $\lambda$ of 0 nm to 460 nm. The container 13 is made of a white polycarbonate resin fabricated by a transfer mold method, for example. The depression 12 has a mortar shape which is formed by an opening, an inclined side surface and a bottom. The depression 12 serves as a reflection cup for directing the light emitted from the semiconductor light-emitting element 11 to the opening of the depression.

The optical semiconductor device 10 is provided with a first fluorescent material layer 14 and a second fluorescent material layer 14a.

The first fluorescent material layer 14 is formed on an upper surface of the semiconductor light-emitting element 11 which is located on the opening side of the depression 12. The first fluorescent material layer 14 is excited by the light emitted from the semiconductor light-emitting element 11 to emit yellow fluorescent light having a first wavelength $\lambda$ of 1 nm to 590 nm which is longer than the emission wavelength $\lambda$ of 0 nm of the semiconductor light-emitting element 11.

The second fluorescent material layer 14a has portions 15 and 16. The portion 15 is formed on a lower surface of the semiconductor light-emitting element 11 which is located on the bottom of the depression 12. The portion 16 is formed on a side surface of the semiconductor light-emitting element 11. The second fluorescent material layer 14a is excited by the light emitted from the semiconductor light-emitting element 11 to emit red fluorescent light having a second wavelength $\lambda$ of 2 nm to 650 nm which is longer than the first wavelength $\lambda$ of 1 nm.

The semiconductor light-emitting element 11 is provided with a substrate 11a which is transparent to a wavelength $\lambda$ of 0 nm to 2 nm. The substrate 11a is a sapphire substrate at a thickness of approximately 100 μm, for example. A semiconductor layer 11d composed of an N-type nitride semiconductor is formed on the transparent substrate 11a. A light-emitting layer 11b composed of a nitride semiconductor is formed on the semiconductor layer 11d. A semiconductor layer 11e composed of a P-type nitride semiconductor is formed on the light-emitting layer 11b. Electrodes 11c and 11c are provided on the portion of the semiconductor layers 11d and 11e, respectively. When a voltage is applied to the electrodes 11c and 11c to provide electrical current across the light-emitting layer 11b, the semiconductor light-emitting element 11 emits blue light having a light-emission wavelength λ of 0 nm to 460 nm.

The portion 15 of the second fluorescent material layer 14a is attached on the bottom of the depression 12 with an adhesive material 17 such as a silver (Ag) paste. The semiconductor light-emitting element 11 is connected to lead terminals 18a and 18a, which penetrate a lower wall of the container 13, through electrodes 11c and 11c, metal balls 11f and 11f, and metal wires 18 and 18.

The first fluorescent material layer 14 is formed to cover the electrodes 11c and 11c, metal balls 11f and 11f and portions of the wires 18 and 18.

The first fluorescent material layer 14 may be formed by applying a yellow fluorescent material layer. The yellow fluorescent material may be a resin containing a yellow fluorescent material and a diffusion agent. The yellow fluorescent material may be $(Me_{1-y}Eu_y)_2SiO_4:Eu^{2+}$ wherein Me is at least one alkaline earth metal element selected from Ba, Sr, Ca and Mg, and the "y" satisfies $0<y\leqq1$), or $(Y, Cd)_3(Al, Ga)_5O_{12}$: $Ce^{3+}$.

The second fluorescent material layer 14a is a red fluorescent material layer. The red fluorescent material layer may be formed by applying a resin containing a red fluorescent material and a diffusing agent. The red fluorescent material may be $(Me_{1-y}Eu_y)_2Si_5N_8$ wherein Me is at least one alkaline earth metal element selected from Ba, Sr, and Ca, and the "y" satisfies $0\leqq y\leqq1$), or $(Me_{1-y}Eu_y) AlSiN_3$ wherein Me is at least one alkaline earth metal element selected from Ba, Sr, and Ca, and the "y" satisfies $0\leqq y\leqq1$).

The first fluorescent material layer 14 is directly excited by the blue light emitted from the semiconductor light-emitting element 11 to emit yellow fluorescent light. In the same manner, the second fluorescent material layer 14a is also directly excited by the blue light to emit red fluorescent light. These blue, yellow and red light are mixed to obtain a white-grouped mixed light.

FIG. 2A is a graph showing a relative value of luminescent intensity of the present embodiment in comparison with a relative value of luminescent intensity of a comparative example 1. FIG. 2B is a graph showing a relative value of luminescent intensity of the above embodiment of the present invention in comparison with a relative value of luminescent intensity of a comparative example 2. In FIGS. 2A and 2B, stripes indicated by a solid line show a luminescent intensity of the present embodiment. Stripes indicated by dashed lines show luminescent intensities of the comparative examples 1 and 2 respectively. Each of arrows 21 to 27 shows the light indicated by the end point of each of the arrows is excited by the light indicated by the starting point of each of the arrows.

The comparative example 1 is an example of an optical semiconductor device having a structure where a red fluorescent material layer is formed on the upper surface of the semiconductor light-emitting element and a yellow fluorescent material layer is stacked on the red fluorescent material layer. A comparative example 2 is an example of an optical semiconductor device having a structure where a red and yellow fluorescent material layers are formed on the upper and lower surfaces of the semiconductor light-emitting element respectively.

As shown in FIG. 2A, in the present embodiment, yellow and red fluorescent materials are excited by the blue light emitted from the semiconductor light-emitting element 11. Portions of the blue light are emitted in upward and downward directions. The portions of the blue light have the same light intensity approximately. Thus, the yellow and red fluorescent materials can emit balanced amounts of fluorescent light respectively.

On the other hand, in the comparative example 1, the red fluorescent material is excited by the blue light emitted from the semiconductor light-emitting element. The yellow fluorescent material is excited by the blue light passed through the red fluorescent material layer.

In the present embodiment and the comparative example 1, the blue lights of substantially the same intensity is used. As a result, the red lights also show substantially the same intensity. The blue light used in the comparative example 1 is absorbed and reflected by the red fluorescent material. Accordingly, the intensity of the yellow light becomes reduced by ΔP2 since the intensity of the blue light to be irradiated to the yellow fluorescent material decreases after passing the red fluorescent material. As a result, the intensities of the yellow and red lights become unbalanced to show a relatively large rate of the red light with respect to the yellow light.

As shown in FIG. 2B, in the comparative example 2, the yellow fluorescent material is excited by the blue light emitted from the semiconductor light-emitting element. The red fluorescent material is excited by the blue light and the yellow light radiated from the excited yellow fluorescent material as indicated by the arrow 27.

The luminescence intensities of the yellow and red fluorescent materials, which are produced by the blue light itself, are balanced, because portions of the blue light are emitted in upward and downward directions and have approximately the same intensity.

However, the intensity produced by the excitation of the red fluorescent material with the yellow light is added to the luminescence intensity of the red fluorescent material produced by the blue light. Consequently, the intensity of the red light is increased by ΔP3. On the other hand, the intensity of the yellow light is reduced by ΔP4 because the yellow light is absorbed and reflected by the red fluorescent material. As a result, the intensities of the yellow and red lights are unbalanced to show a relatively large rate of the red light with respect to the yellow light.

The present embodiment may reduce loss of intensity caused by the absorption and reflection of the yellow light by the red fluorescent material. Thus, the brightness of the white-grouped mixed light obtained may be sufficient.

FIG. 3 is a view showing the direction and intensity of a multiple number of lights produced by the optical semiconductor device according to the first embodiment. B, Y, and R indicate blue, yellow and red light respectively. The Arrows shown in FIG. 3 indicate directions of the lights. The width of each of the arrows indicates intensity of each of the lights.

In the present embodiment, the second fluorescent material layer 14a has the portion 16 formed on the side surface of the semiconductor light-emitting element 11 as well as the portion 15 formed on the lower surface of the semiconductor light-emitting element 11. A blue light Bi and a yellow light Yi are emitted from the interior of the semiconductor light-emitting element 11 to its side and are absorbed and reflected by the red fluorescent material.

The above configuration makes it possible to reduce the amount of light having a wavelength shorter than that of the red light, which radiates the inclined side surface of the depression 12. Accordingly, the container 13 may be prevented from being discolored and deteriorated by the light having a wavelength shorter than that of the red light.

A method of manufacturing the optical semiconductor device 10 will be described.

Figure 4A:
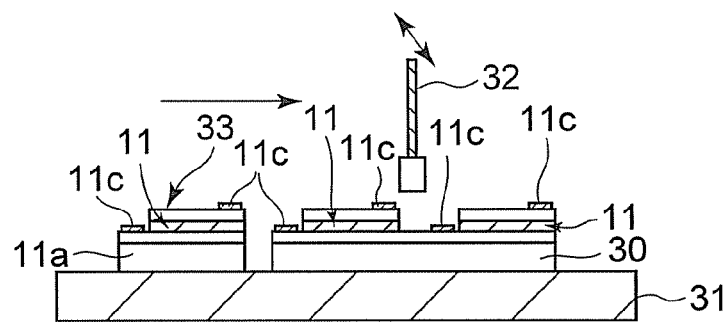
FIGS. 4A to 4H are cross-sectional views showing examples of manufacturing steps of the optical semiconductor device according to the first embodiment respectively.

Prior to the step shown in FIG. 4A, a wafer 30, on which a plurality of semiconductor light-emitting elements 11, ..., 11 are formed, is adhered to a dicing sheet 31. As shown in FIG. 4A, the wafer 30 is diced using a dicing blade 32 to be divided into plural chips 33, ..., 33. Each of the chips 33 has a width W. The chips 33, ..., 33 constitute the semiconductor light-emitting elements 11, ..., 11 respectively. The dicing sheet 31 is stretched to give an interval L among the chips 33, ..., 33.

Figure 4B:
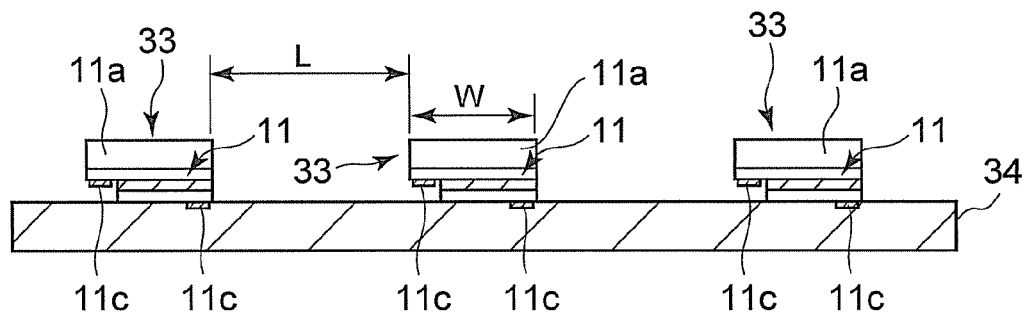

As shown in FIG. 4B, an adhesive sheet 34 is bond to the lower surfaces of the semiconductor light-emitting elements 11, ..., 11 on the electrode side. The dicing sheet 31 is peeled off so that the transparent substrate 11a, ..., 11a may face upward.

Figure 4C:
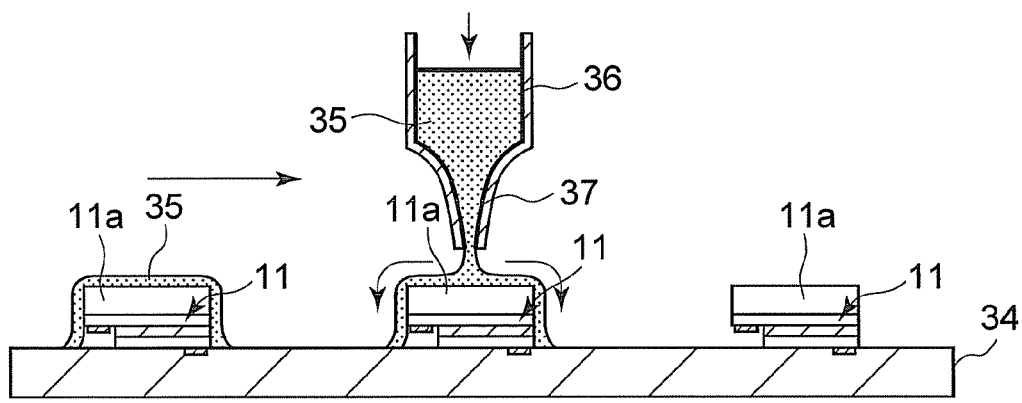

As shown in FIG. 4C, a liquid resin 35, containing a red fluorescent material and a diffusing agent, is dropped onto the substrates 11a, ..., 11a one after another from a dispenser 36 through a nozzle 37.

The liquid resin 35 is spread on a main surface of the substrate 11a of each of the semiconductor light-emitting element 11, ..., 11. The liquid resin 35 further flows downward along the side surface of each of the semiconductor light-emitting element 11, ..., 11. The top surface and the side surface of each of the semiconductor light-emitting element 11, ..., 11 are covered with the liquid resin 35.

It is necessary to adjust viscosity of the liquid resin 35 in advance so that the top and side surfaces of the semiconductor light-emitting element 11, ..., 11 are covered fully. When the viscosity is too large, it becomes difficult to cover the side surfaces with the liquid resin 35 fully. When the viscosity is too small, it allows the resin 35 to flow even onto the adhesive sheet 34. Accordingly, the liquid resin 35 dropped onto one of the semiconductor light-emitting element 11, ..., 11 is likely to flow to an adjacent semiconductor light-emitting element and to be unified with the resin covering the latter element. Accordingly, the interval L is desirably about three to five times of the width W of the chips 33, for example, in consideration of the expansion degree of the liquid resin 35 and the manufacturing efficiency and so forth.

Figure 4D:
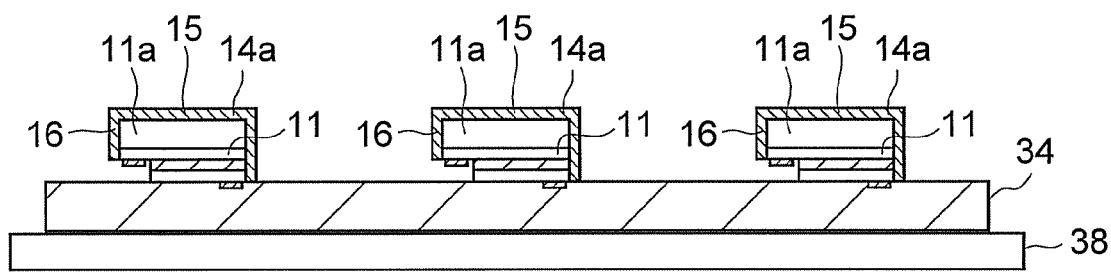

As shown in FIG. 4D, the adhesive sheet 34 is set on a hot plate 38 to cure the liquid resin 35 covering the surface of the semiconductor light-emitting elements 11, ..., 11. The second fluorescent material layer 14a, ..., 14a having portions 15 and 16 are formed along the top and side surfaces of the semiconductor light-emitting elements 11, ..., 11.

Figure 4E:
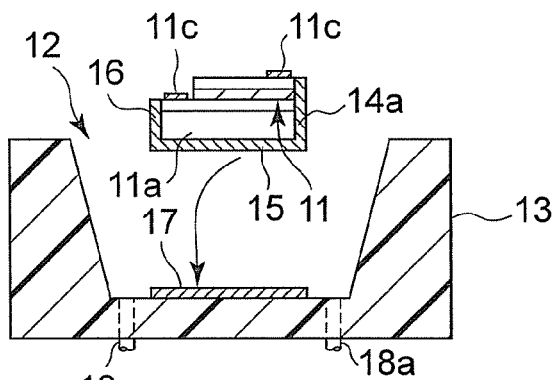
Figure 4F:
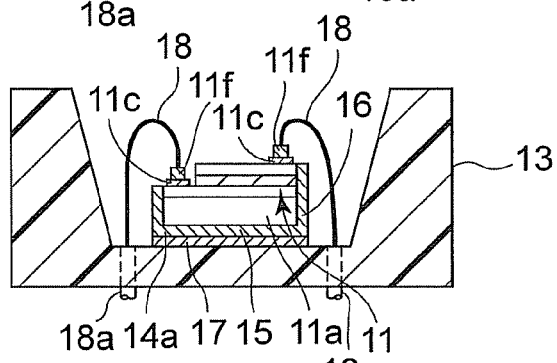

As shown in FIG. 4E, an adhesive material 17 is applied onto the bottom of a depression 12 of a container 13. One of the semiconductor light-emitting element 11, ..., 11 is bonded to the adhesive material 17 with the transparent substrates 11a facing downward. As shown in FIG. 4F, the wires 18 and 18 are bonded to the electrodes 11c and 11c and lead terminals 18a and 18a to electrically connect the semiconductor light-emitting element 11 to the lead terminals.

Figure 4G:
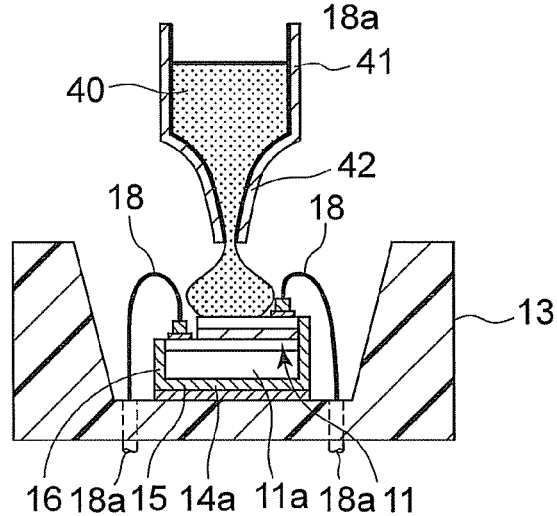

As shown in FIG. 4G, a liquid resin 40, containing a yellow fluorescent material and a diffusing agent, is dropped onto the top surface of the semiconductor light-emitting element 11 on the electrode side from a dispenser 41 through a nozzle 42. The liquid resin 40 spreads on the top surface of the semiconductor light-emitting element 11, and covers the top surface of the semiconductor light-emitting element 11.

The liquid resin 40 is required to have viscosity larger than that of the liquid resin 35 so as not to hang from the top to the side surface of the semiconductor light-emitting element 11. When the viscosity is too large, it becomes difficult to cover the top surface of the semiconductor light-emitting element 11 fully. When the viscosity is too small, it allows the liquid resin 40 to flow to overlap with the second fluorescent material layer 14a.

Figure 4H:
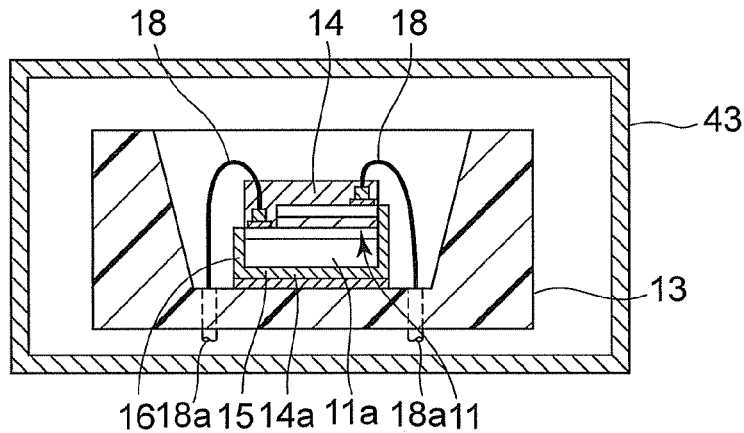

As shown in FIG. 4H, the container 13, in which the semiconductor light-emitting element 11 is disposed, is placed in an oven 43 to cure the liquid resin 40 covering the top surface of the semiconductor light-emitting element 11. The first fluorescent material layer 14 is formed on the top surface of the semiconductor light-emitting element 11.

The container 13 is taken out of the oven 43. The depression 12 of the container 13 is filled with a transparent resin 19 to complete the optical semiconductor device 10 as shown in FIG. 1.

As described above, in the optical semiconductor device 10 of the present embodiment, the first fluorescent material layer 14 is formed on the top surface of the semiconductor light-emitting element 11 to emit yellow light. The second fluorescent material layer 14a is formed on the lower and side surfaces of the semiconductor light-emitting element 11 to emit red light.

As a result, light loss, which is caused by the absorption and reflection of the blue and yellow lights by the red fluorescent material, may be suppressed.

Further, the blue and yellow lights radiated from the inner to the side surface of the semiconductor light-emitting element 11 is absorbed and reflected by a fluorescent material emitting red light. Thus, the inclined side surface of the depression 12 of the container 13 may avoid being irradiated with light having a wavelength shorter than that of the red light.

The first and second fluorescent material layers 14 and 14a may emit light with high efficiency. Deterioration of the container 13 may be suppressed.

In the present embodiment, the second fluorescent material layer 14a contains a fluorescent material which emits one kind of red light. The second fluorescent material layer 14a may contain a plurality of fluorescent materials which emit multiple kinds of red light respectively having different wavelengths.

Alternatively, a plurality of resins, which contain different fluorescent materials respectively, may be employed. The fluorescent materials may emit multiple kinds of red light respectively having different wavelengths. The plurality of resins may be applied in two or more layers. In the case, a liquid resin, which contains a fluorescent material to emit red light having a longer wavelength, may be formed on the side closer to the surface of the semiconductor light-emitting element 11.

The above structure expands the fluorescent spectrum width of the second fluorescent material layer 14a to emit red light so that the obtained white-grouped light may show a warmer color.

In the above described manufacturing method, the liquid resin 35, which contains a fluorescent material to emit red light, is applied to the semiconductor light-emitting element 11 and is cured to form the second fluorescent material layer 14a. In place of this method, a sheet of a solid, in which a red fluorescent material powder is dispersed, is prepared and pasted on the lower and side surfaces of the semiconductor light-emitting element 11 to form the second fluorescent material layer 14a. The sheet may be produced by kneading a fluorescent material powder to emit red light with a binder resin, by compressing the kneaded mixture and by sintering the compressed mixture.

Figure 5:
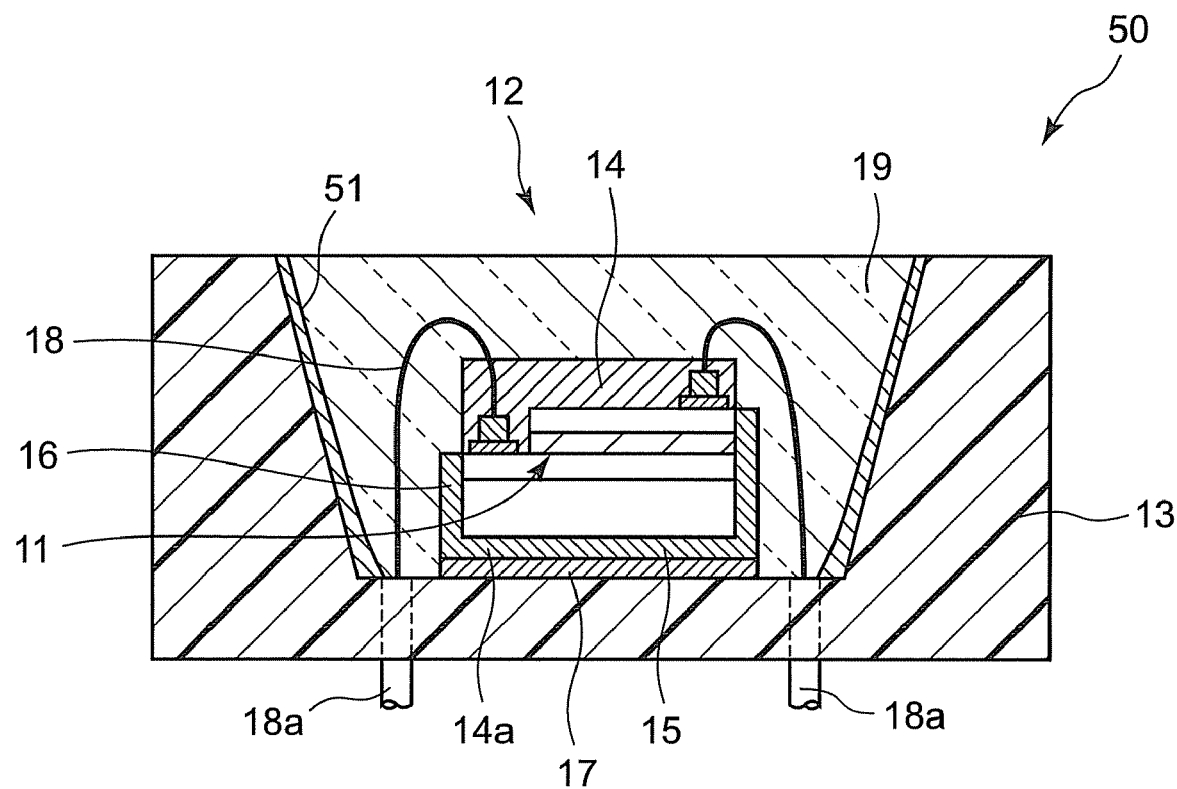
FIG. 5 is a cross-sectional view showing an optical semiconductor device according to a second embodiment of the present invention.

FIG. 5 shows a second embodiment of the invention. In FIG. 5a, a fluorescent material layer 51 is further formed on the inclined side surface of the depression 12 of the container 13 to emit red light. Though the output of the red light becomes smaller, deterioration of the container 13 may be prevented more sufficiently.

The same fluorescent material as that of the second fluorescent material layer 14a can be used for the fluorescent material layer 51.

The fluorescent material layer 51 can be formed by applying the liquid resin 35 on the inclined side surface of the depression 12 of the container 13 by a spraying method, for example, and by curing the applied liquid resin 35.

Figure 6:
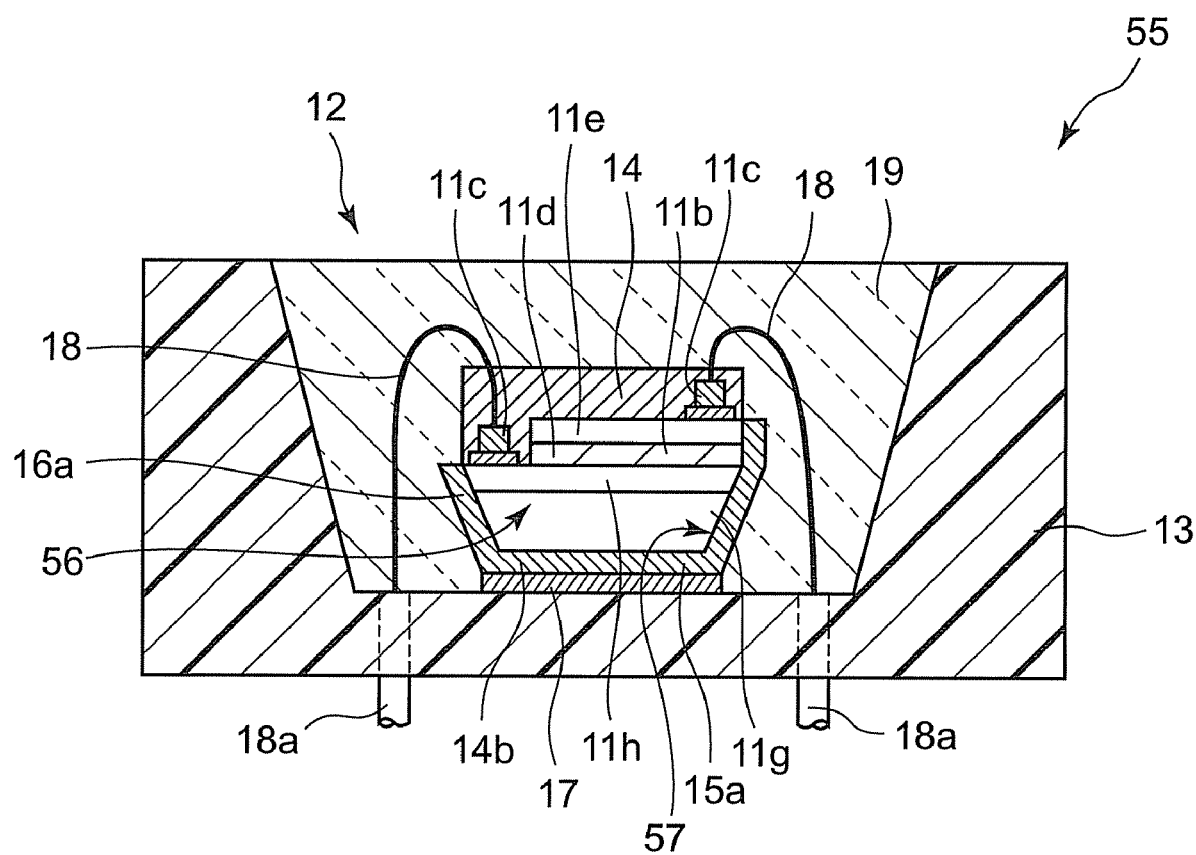
FIG. 6 is a cross-sectional view showing an optical semiconductor device according to a third embodiment of the present invention.

In the first embodiment of FIG. 1, the semiconductor light-emitting element 11 is a rectangular solid shape. Alternatively, a third embodiment of the invention is provided as shown in FIG. 6. In FIG. 6, the side surfaces of a transparent substrate 11g of an optical semiconductor device 55 and a semiconductor layer 11h composed of N-type nitride semiconductor of a semiconductor light-emitting element 56 is inclined. The side surfaces 57 of the semiconductor light-emitting element 56 is inclined to form a folding-fan shape widen from the substrate 11g toward the light-emitting layer 11b. In the embodiment, the second fluorescent material layer 14b, which has the portions 15a and 15b to emit red light, is shaped to conform to the shape of the optical semiconductor device 55.

Thereby, efficiency in extracting light from the semiconductor light-emitting element 56 is increased, and the output of the white mixed light is further increased as compared to that in the first and second embodiments.

In the third embodiment, the side surfaces 57 inclined in a folding-fan shape can easily be covered with the liquid resin 35 as compared to the case where the vertical side surfaces are formed in the semiconductor light-emitting element 11 as in the first and second embodiments.

Figure 7:
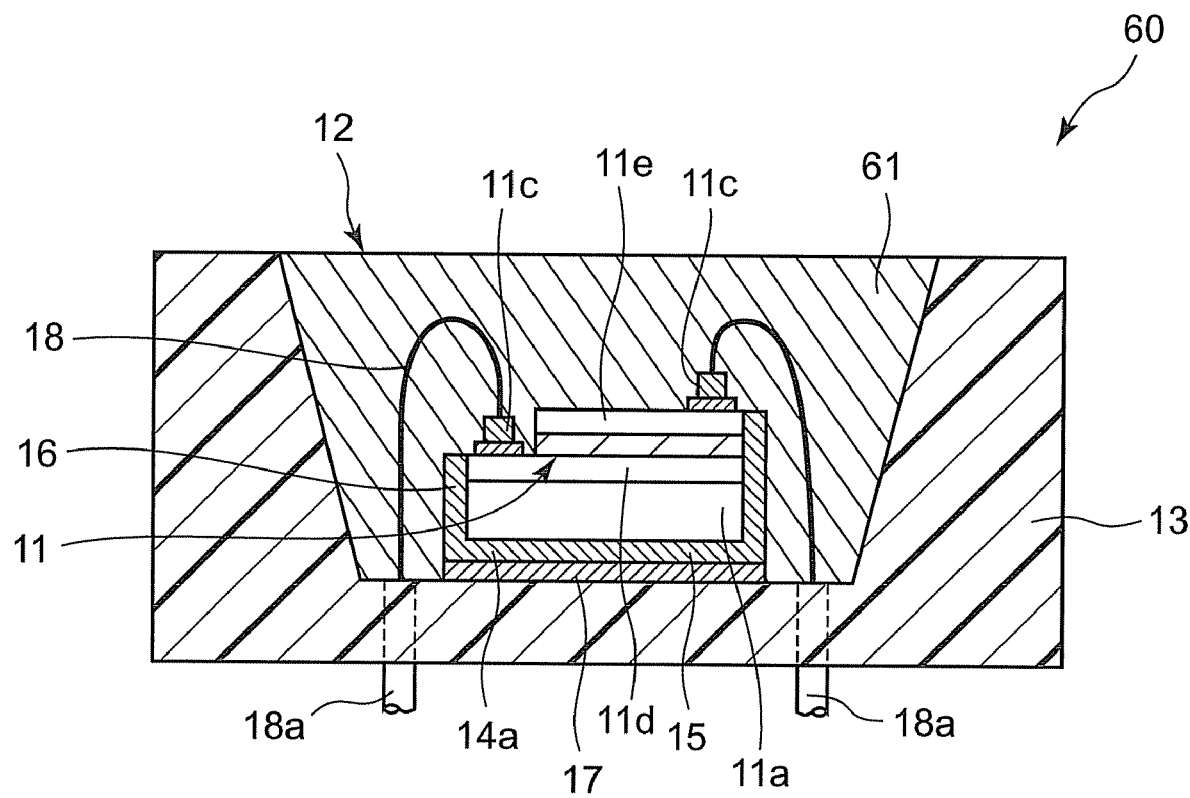
FIG. 7 is a cross-sectional view showing an optical semiconductor device according to a fourth embodiment of the present invention.

FIG. 7 is a cross-sectional view showing an optical semiconductor device according to a fourth embodiment of the present invention.

As shown in FIG. 7, in an optical semiconductor device 60 of the present embodiment, the depression 12 of the container 13 is filled with a first fluorescent material layer 61. The first fluorescent material layer 61 is formed by filling the depression 12 with the mixture formed by mixing a fluorescent material emitting yellow light and a diffusing agent in a transparent resin, and by curing the resultant mixture in an oven.

This method allows for the simplification of the manufacturing process as compared to a method in which the depression 12 of the container 13 is filled with the transparent resin 19 after the first fluorescent material layer 14 emitting yellow light is formed on the semiconductor light-emitting element 11 as shown in FIG. 1, 5 or 6.

The fluorescent material layer 51 emitting red light may further be formed on the inclined side surface of the depression 12 of the container 13 as in the case of FIG. 5.

The above method allows the inclined side surface of the depression 12 of the container 13 to be irradiated with the yellow light by the first fluorescent material layer 61. Thereby, the container can be inhibited from being discolored and deteriorated.

An optical semiconductor device according to a fifth embodiment of the present invention will be described using FIGS. 8, and 9A to 9D.

Figure 8:
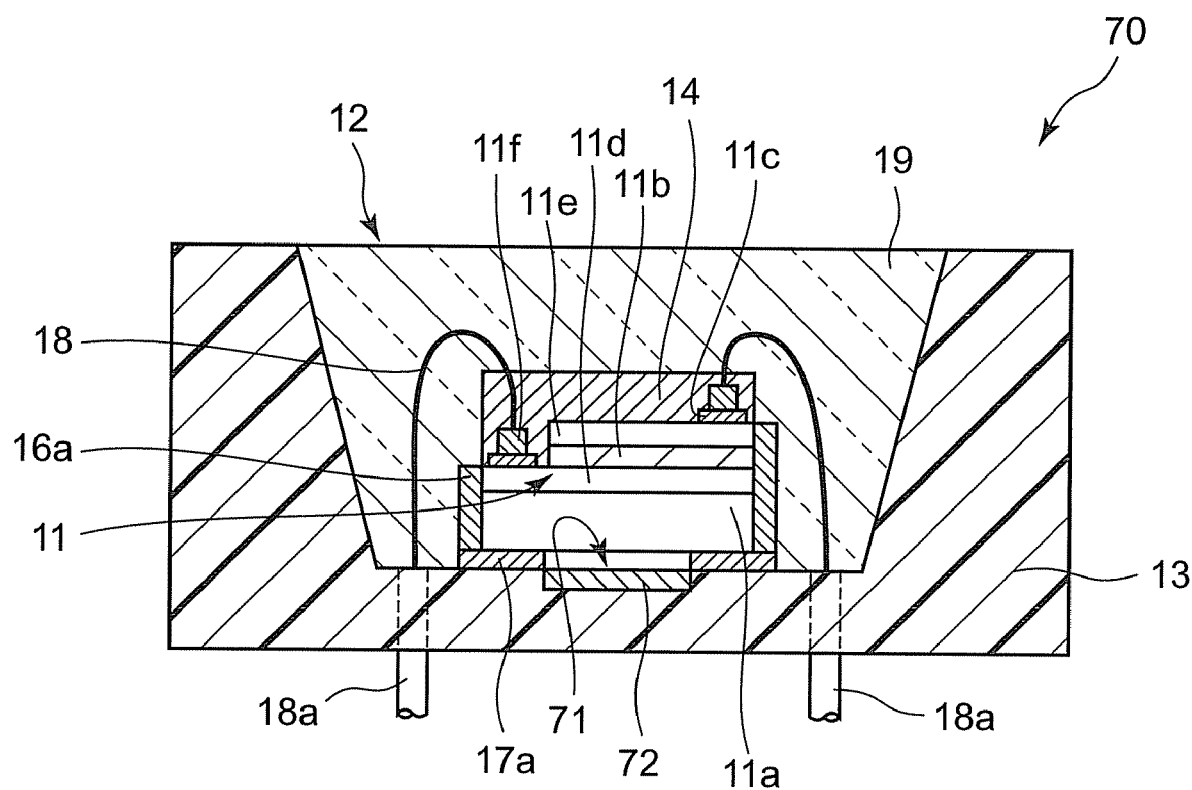
FIG. 8 is a cross-sectional view showing an optical semiconductor device according to a fifth embodiment of the present invention.
Figure 9A:
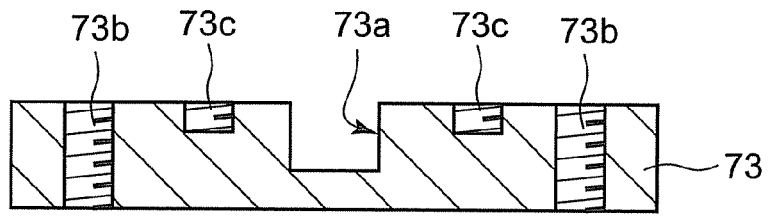
FIGS. 9A to 9D are cross-sectional views to explain manufacturing steps of the optical semiconductor device according to the fifth embodiment, respectively.
Figure 9B:
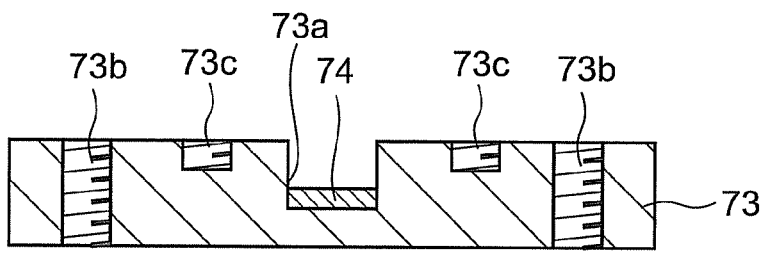
Figure 9C:
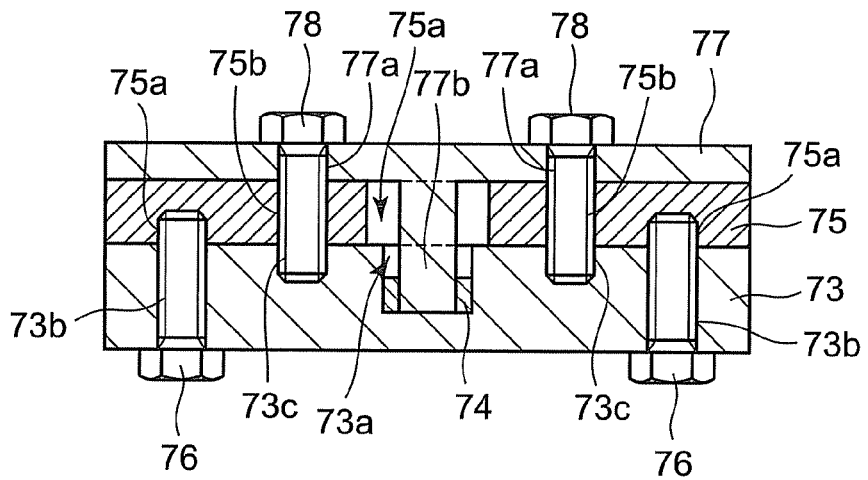
Figure 9D:
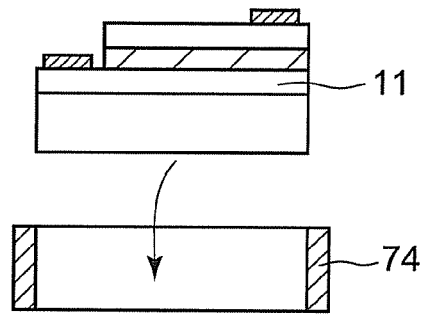

FIG. 8 is a cross-sectional view showing the optical semiconductor device according to the fifth embodiment. FIGS. 9A to 9D are cross-sectional views for explaining manufacturing steps of the optical semiconductor device of the fifth embodiment. FIGS. 9A to 9C are views in a reduced scale of FIG. 8. FIG. 9D is in the substantially same scale as that of FIG. 8.

As shown in FIG. 8, in an optical semiconductor device 70 of the present embodiment, the semiconductor light-emitting element 11 is placed in the depression 12 of the container 13. As in the first embodiment, the fluorescent material layer 14 which emits yellow light is formed on the top surface of the semiconductor light-emitting element 11.

A depression 71 having a relatively small depth and small area is formed on the bottom of the depression 12 of the container 13. A second fluorescent material layer 72 which emits red light is embedded in the depression 71 in place of the portion 17 located under the second fluorescent material layer 14a in FIG. 1. The second fluorescent material layer 72 is formed by filling the depression 71 formed at the bottom of the container 13 with a liquid resin containing a fluorescent material, and by curing the filled liquid resin. A third fluorescent material layer 16a which emits red light is formed on the side surface of the semiconductor light-emitting element 11 in place of the portion 16 on the side of the second fluorescent material layer 14a in FIG. 1.

An air gap is provided between the bottom of the transparent substrate 11a of the semiconductor light-emitting element 11 and the second fluorescent material layer 72. The air gap may be filled with a transparent resin. There is an adhesive material 17a between the area surrounding the second fluorescent material layer 72 at the bottom of the container 13 and the bottom of the transparent substrate 11a to adhesively attach the above area at the bottom of the container 13 to the transparent substrate 11a. If the adhesive material 17a is transparent, the air gap may also be filled with the adhesive material 17a.

The area of the depression 71 in transverse direction in the figure may be suitably determined within a range which allows the adhesive material 17a to have an assured area such that the fixing strength of the semiconductor light-emitting element 11 to the container 13 by the adhesive material 17a can be sufficient. When the area of the semiconductor light-emitting element 11 in the transverse direction is 300 $\mu m^2$, for example, the area of the depression 71 in transverse direction is desirably about 150 $\mu m^2$.

Among the manufacturing steps of the optical semiconductor device 70, a method of forming the third fluorescent material layer 16a on the side surface of the semiconductor light-emitting element 11 will be described.

As shown in FIG. 9A, a first mold 73 having a square-shaped depression 73a slightly larger than the semiconductor light-emitting element 11 is prepared.

As shown in FIG. 9B, a predetermined amount of a resin 74 (slurry) containing a fluorescent material is poured in the depression 73a of the first mold 73 having screw holes 73b, 73b, 73c and 73c after applying a mold lubricant in the depression 73a.

Subsequently, as shown in FIG. 9C, a polytetrafluoroethylene spacer 75 provided with screw holes 75a, 75a, 75b and 75b in the position corresponding respectively to the screw holes 73b, 73b, 73c and 73c is prepared. The spacer 75 has a through-hole 75a of a size slightly larger than the depression 73a. The spacer 75 is set on the first mold 73. The first mold 73 and the spacer 75 are positioned so that the depression 73a and the through-hole 75a are aligned with each other in a concentric fashion to fix the first mold 73 and the spacer 75 with screws 76 and 76.

A second mold 77 having a protrusion 77b of the same size as that of the semiconductor light-emitting element 11 is prepared. The second mold 77 has screw holes 77a in the position corresponding respectively to the screw holes 73b, 73b, 73c and 73c provided to the spacer 75. A mold lubricant is previously applied on the protrusion 77b of the second mold 77.

The second mold 77 is set on the spacer 75. Subsequently, the second mold 77 and the spacer 75 are positioned so that the depression 73a and the protrusion 77b are aligned with each other in a concentric fashion to fix the second mold 77 and the spacer 75 with screws 78 and 78.

The fore-end of the protrusion 77b of the second mold 77 is consequently pressed against the bottom of the depression 73a of the first mold 73. The resin 74 is pushed out from the bottom of the depression 73a to the circumference of the protrusion 77b to be raised.

The first mold 73, the spacer 75 and the second mold 77 which have been fastened to be united are placed in an oven to cure the resin 74 to be solidified. The screws 78 are unscrewed to remove the second mold 77. Then, the solidified resin 74 containing a fluorescent material is taken out. The solidified resin 74 is of a hollow square shape, the top and bottom edges of which are open.

As shown in FIG. 9D, the same resin (slurry) as the resin 74 is applied inside the solidified resin 74. Subsequently, the semiconductor light-emitting element 11 is mounted in the resin 74. Thereafter, they are cured in the oven to firmly fix the solidified resin 74 and the semiconductor light-emitting element 11. The resin 74 serves as the third fluorescent material layer 16a in FIG. 8.

When the fore-end of the protrusion 77b of the second mold 77 is controlled so as not to contact with the bottom of the depression 73a of the first mold 73 in the above described process of FIG. 9C, the resin 74 to be a fluorescent material layer is open only at the upper edge. The resin 74 has a shape having lower and side portions, as the second fluorescent material layer 14a in FIG. 1. Such a fluorescent material layer may be used.

When the semiconductor light-emitting element 11 has lower and side fluorescent material layers which are different in material from each other, the amount of the resin 74 containing a fluorescent material emitting red light which is to be put in the first mold 73 and the thickness of the spacer 75 are further changed, for example. The lower and side fluorescent material layers may be prepared separately and adhered to the semiconductor light-emitting element 11 separately.

The separate formation of the lower and side fluorescent material layers of the semiconductor light-emitting element 11 allows red fluorescent materials of different properties to be used in each of the lower and side fluorescent material layer.

By increasing the light absorption rate of the side fluorescent material layer more than that of the lower fluorescent material layer in the wavelength range shorter than that of the red light, for example, an effect of preventing the deterioration of the container 13 can be increased without diminishing the function of the container 13 as a reflection cup.

The light absorption rate of a fluorescent material can be increased by increasing the concentration of a Europum (Eu) which is an activator of a fluorescent material. The increase in a light absorption rate allows for the reduction in the film thickness of a fluorescent material to prevent the generation of cracks in a fluorescent material due to thermal stress.

In the fifth embodiment described above, the depression 71 provided at the bottom of the depression 19 of the container 13 is a rectangular solid shape. Instead of the rectangular solid shape, a shape which is curved downward may also be used.

The use of a shape which is curved downward provides an advantage that the red light from the fluorescent material layer 72 can be focused on the opening side of the depression 12 of the container 13.

In the fifth Embodiment, the second fluorescent material layer 72 is formed by filling the depression 71 at the bottom of the container 13 with a liquid resin containing a fluorescent material, and by curing the filled liquid resin. Alternatively, a sheet in which a red fluorescent material powder is dispersed in a solid may also be mounted in the depression 71. The sheet is a ceramics produced by sintering a compact formed by kneading a red fluorescent material powder, for example, with a binder, and compressing the kneaded mixture.

The ceramics is composed of fluorescent material portionicles which are compressed and sintered to be tightly contacted with each other with no air gap to optically be united, and therefore is able to inhibit excitation light from being scattered as compared to a resin in which a fluorescent material is dispersed. As a result, a higher fluorescence can be obtained.

Figure 10:
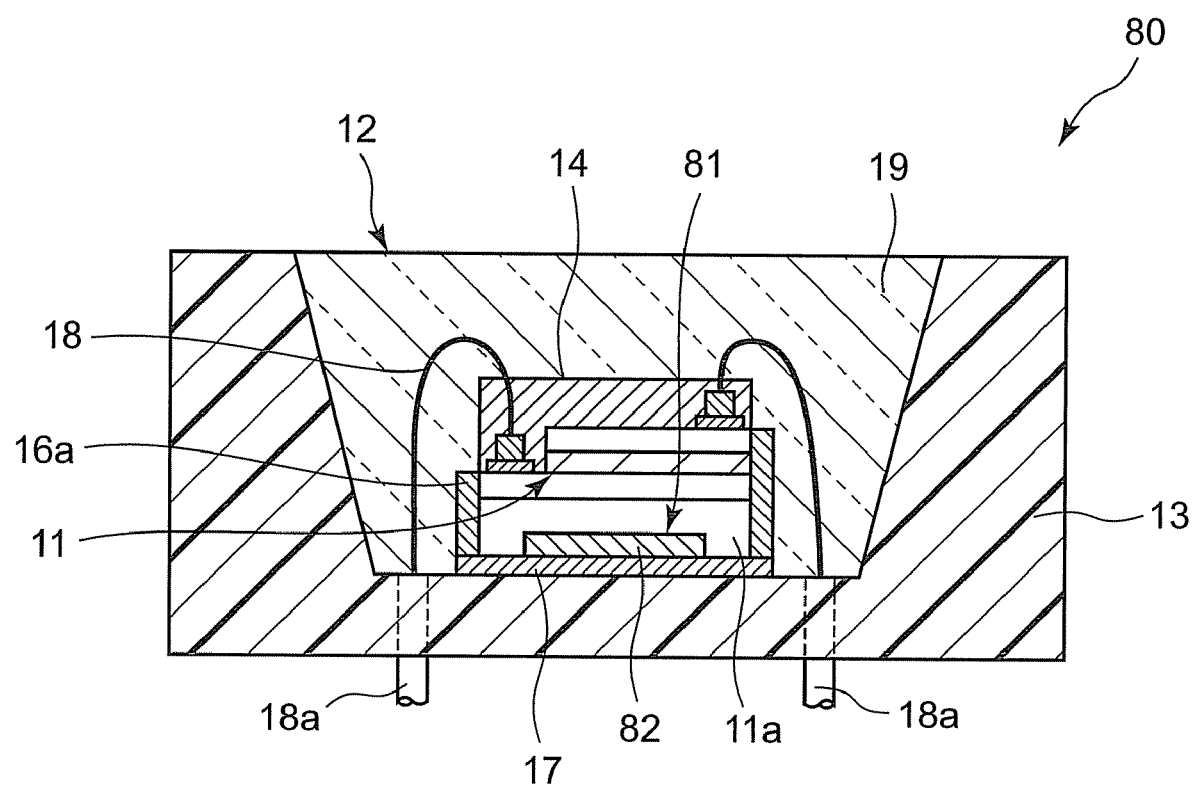
FIG. 10 is a cross-sectional view showing an optical semiconductor device according to a sixth embodiment of the present invention.

FIG. 10 is a cross-sectional view showing an optical semiconductor device according to a sixth embodiment of the present invention.

In the sixth embodiment, a depression 81 is provided at the bottom of the transparent substrate 11a which is a construction member of the semiconductor light-emitting element 11. The second fluorescent material layer 82 which emits red light is embedded in the depression 81. The third fluorescent material layer 16a which emits red light is formed on the side surface of the semiconductor light-emitting element 11. The bottom of the transparent substrate 11a and the second fluorescent material layer 82 are adhesively attached to the bottom of the depression 12 of the container 13 with the adhesive material 17.

The other configurations are the same as those of the first embodiment of FIG. 1. Such a structure allows the semiconductor light-emitting element 11 and the adhesive material 17 to assure the sufficient contact area therebetween to increase the mechanical strength.

Figure 11:
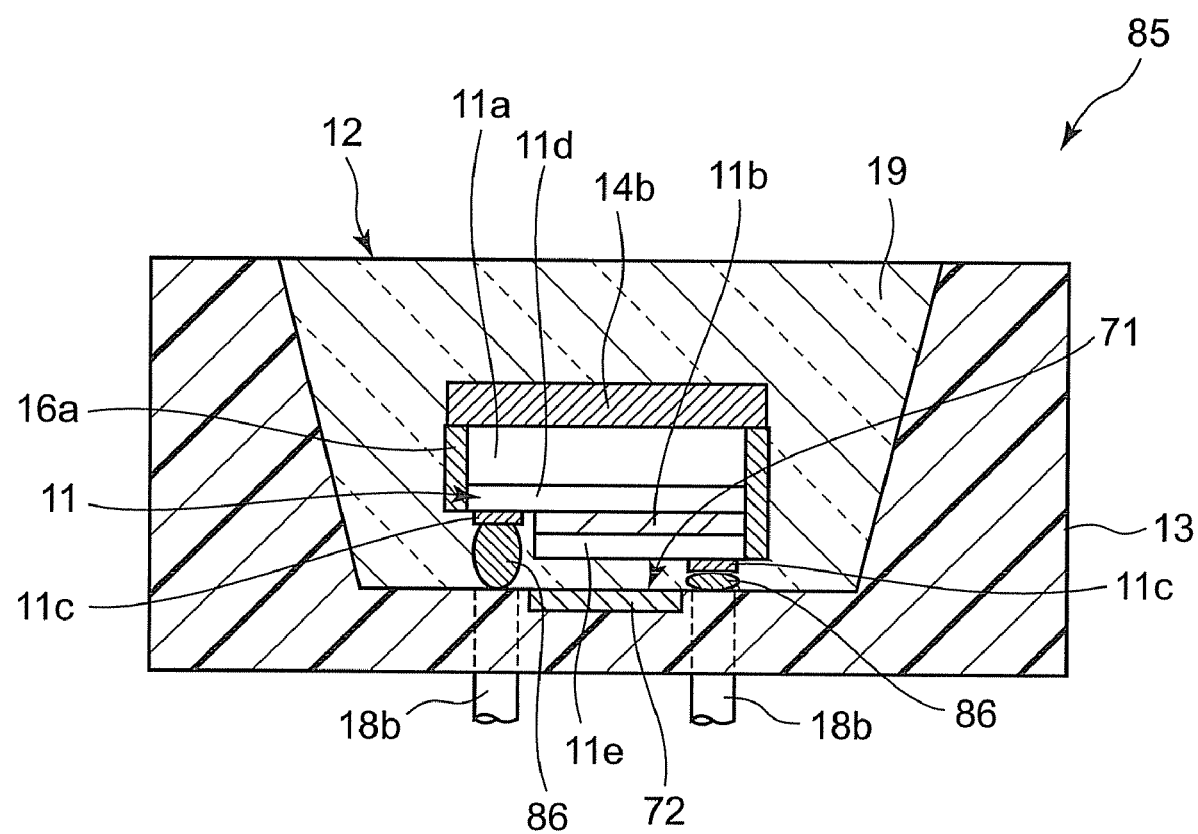
FIG. 11 is a cross-sectional view showing an optical semiconductor device according to a seventh embodiment of the present invention.

FIG. 11 is a cross-sectional view showing an optical semiconductor device according to a seventh embodiment of the present invention.

In an optical semiconductor device 85, the semiconductor light-emitting element 11 is connected to lead terminals 18b and 18b by a flip chip bonding method. The semiconductor light-emitting element 11 is turned upside down from the position which is taken in the fifth embodiment of FIG. 8. The second red light emitting fluorescent material layer 72 and the third red light emitting material layer 16a are formed on the side surface of the semiconductor light-emitting element 11 and in the depression 17 at the bottom of the container 13, respectively, as in the fifth embodiment of FIG. 8. The first yellow light emitting fluorescent material layer 14b is formed on the top surface of the transparent substrate 11a of the semiconductor light-emitting element 11.

As shown in FIG. 11, bump electrodes 86 and 86 are formed on the electrodes 11c and 11c. The bump electrodes 86 and 86 are connected to the lead terminals 18b and 18b which penetrate the container 13. Such a structure eliminates the need for the wires 18 and 18 unlike in the fifth embodiment of FIG. 8. Therefore, a problem of the connection failure of the wires 18 and 18 caused by the stress of the transparent resin 19 may be eliminated.

Figure 12:
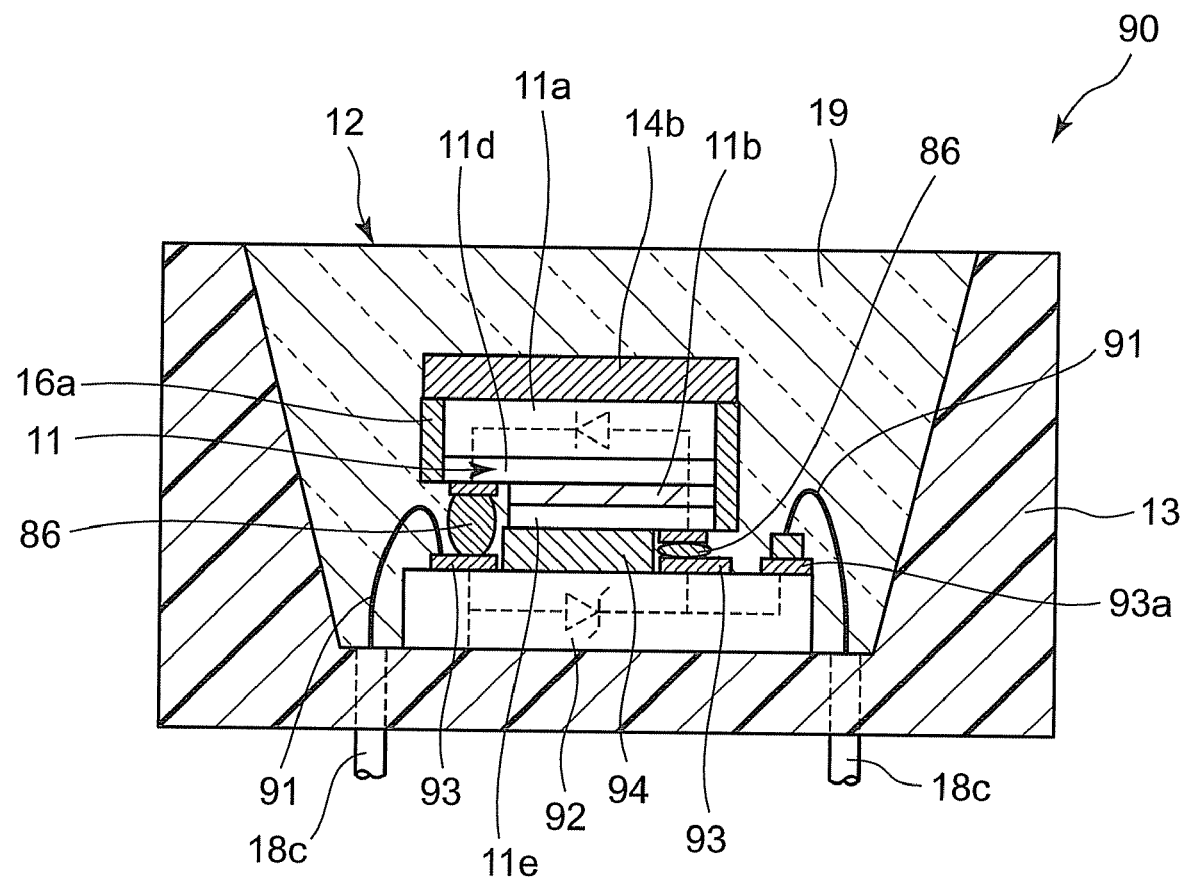
FIG. 12 is a cross-sectional view showing an optical semiconductor device according to an eighth embodiment of the present invention.

FIG. 12 is a cross-sectional view showing an optical semiconductor device according to an eighth embodiment of the present invention.

In the optical semiconductor device 90 of FIG. 12, a Zener diode 92 is adhesively attached to the bottom surface of the depression 12 of the container 13. The bump electrodes 86 and 86 are formed on the electrodes 11c and 11c of the optical semiconductor light-emitting element 11. The bump electrodes 86 and 86 are connected to the electrodes 93 and 93 on the Zener diode 92.

The second red light emitting fluorescent material layer 94 is provided between a semiconductor layer 11e composed of a p-type nitride semiconductor in a semiconductor light-emitting element 11 and the top surface of the Zener diode 92. The second red light emitting fluorescent material layer 94 is fixed to the semiconductor layer 11e and the Zener diode 92 by a method to be described below. The Zener diode 92 and the semiconductor light-emitting element 11 are electrically connected in parallel to each other in the reverse direction.

The electrodes 93a and 93a on the Zener diode 92 are connected to the lead terminal 18b and 18b through the wires 91 and 91. The Zener diode 92 functions so as to prevent the electrostatic breakdown of the semiconductor light-emitting element 11.

The second fluorescent material layer 94 can be formed by applying a liquid resin containing a red light emitting fluorescent material on the Zener diode 92 and curing the same in an oven. Alternatively, the second fluorescent material layer 94 can be formed by forming a depression in the upper portion of the Zener diode 92, applying a liquid resin containing a red light emitting fluorescent material in the formed depression, and curing the same in an oven.

A sheet of a solid, in which a fluorescent material powder is dispersed to emit red light, may be sandwiched between the Zener diode 92 and the semiconductor light-emitting element 11 and adhered to the same with an adhesive material. The sheet may be a ceramics. The ceramics may be produced by kneading a fluorescent material powder to emit red light with a binder, by compressing the kneaded mixture and by sintering the compressed mixture.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. An optical semiconductor device comprising:
   a container having a depression to reflect light, the depression having an opening, a bottom and a side surface;
   a semiconductor light-emitting element placed in the depression to emit light;
   a first fluorescent material layer located in the depression, at least a portion of the first fluorescent material layer being provided between the opening of the depression and the semiconductor light-emitting element, and the first fluorescent material layer being excited by the light emitted from the semiconductor light-emitting element to emit light having a first wavelength longer than an light-emission wavelength of the semiconductor light-emitting element; and
   a second fluorescent material layer having first and second portions, the first portion being provided between the bottom of the depression and the semiconductor light-emitting element and located in the depression, the second portion provided between the side surface of the depression and the semiconductor light-emitting element and located in the depression, the second fluorescent material layer being excited by the light emitted from the semiconductor light-emitting element to emit light having a second wavelength longer than the first wavelength.

2. The optical semiconductor device according to claim 1, wherein the semiconductor light-emitting element emits blue light, the first fluorescent material layer emits yellow light, and the second fluorescent material layer emits red light.

3. The optical semiconductor device according to claim 1, wherein the first and second portions of the second fluorescent material layer cover surfaces of the semiconductor light-emitting element respectively on the bottom side and on the side surface side of the depression.

4. The optical semiconductor device according to claim 1, wherein a fluorescent material layer is formed on the side surface of the depression to emit light having the second wavelength.

5. The optical semiconductor device according to claim 1, wherein the semiconductor light-emitting element has an inclined side surface, and the second portion of the second fluorescent material layer covers along the inclined side surface.

6. The optical semiconductor device according to claim 5, wherein the second portion of the second fluorescent material layer is bonded to the depression of the container with an adhesive material.

7. The optical semiconductor device according to claim 1, wherein the first fluorescent material layer is formed in the depression so as to bury the semiconductor light-emitting element and the second fluorescent material layer.

8. The optical semiconductor device according to claim 1, wherein the first fluorescent material layer is formed of a resin having a fluorescent material dispersed to emit a fluorescent lights having the first wavelength, and the second fluorescent material layer is formed of a resin having a fluorescent material dispersed to emit a fluorescent light having the second wavelength.

9. An optical semiconductor device comprising:
   a container having a depression to reflect light, the depression having an opening, a bottom and a side surface;
   a semiconductor light-emitting element placed in the depression to emit light;
   a first fluorescent material layer located in the depression, at least a portion of the first fluorescent material layer being provided between the opening of the depression and the semiconductor light-emitting element, and the first fluorescent material layer further being excited by the light emitted from the semiconductor light-emitting element to emit light having a first wavelength longer than a light-emission wavelength of the semiconductor light-emitting element;
   a second fluorescent material layer located in the depression and provided between the bottom of the depression and the semiconductor light-emitting element, the second fluorescent material layer being excited by the light emitted from the semiconductor light-emitting element to emit light having a second wavelength longer than the first wavelength; and
   a third fluorescent material layer located in the depression and provided between the side surface of the depression and the semiconductor light-emitting element, the third fluorescent material layer being excited by the light emitted from the semiconductor light-emitting element to emit light having the second wavelength longer than the first wavelength.

10. The optical semiconductor device according claim 9, wherein the semiconductor light-emitting element emits blue light, the first fluorescent material layer emits yellow light, and the second and third fluorescent material layers emit red light.

11. The optical semiconductor device according claim 9, wherein the second and third fluorescent material layers are formed apart from each other.

12. The optical semiconductor device according claim 9, wherein the first, second, and third fluorescent material layers are formed of resins having fluorescent materials dispersed respectively.

13. The optical semiconductor device according claim 9, wherein the second fluorescent material layer is formed of a ceramics containing a fluorescent material.

14. The optical semiconductor device according claim 9, wherein the second fluorescent material layer is embedded in another depression provided at the bottom of the depression of the container.

15. The optical semiconductor device according claim 9, further comprising lead terminals, first electrodes and bump electrodes, the lead terminals being provided in association with the container, and the first electrodes being provided on semiconductor layers of the semiconductor light-emitting element to be connected to the lead terminals through the bump electrodes respectively.

16. The optical semiconductor device according claim 9, further comprising lead terminals, first electrodes, a Zener diode and bump electrodes, the lead terminals being provided in association with the container, the first electrodes being provided on semiconductor layers of the semiconductor light-emitting element respectively, and the Zener diode having second electrodes and being provided between the semiconductor light-emitting element and the bottom of the depression of the container, wherein the first electrodes are connected to the second electrodes of the Zener diode through bump electrodes respectively, the semiconductor light-emitting element and the Zener diode being electrically connected to each other in parallel and in a reverse direction, and the Zener diode is connected to the lead terminals.

17. An optical semiconductor device comprising:

a container having a first depression to reflect light, the first depression having an opening, a bottom and a side surface;

a semiconductor light-emitting element placed in the first depression to emit light, the semiconductor light-emitting element having a substrate, and the substrate having a second depression;

a first fluorescent material layer located in the first depression, at least a portion of the first fluorescent material layer being provided between the opening of the first depression and the semiconductor light-emitting element, and the first fluorescent material layer further being excited by the light emitted from the semiconductor light-emitting element to emit light having a first wavelength longer than an light-emission wavelength of the semiconductor light-emitting element;

a second fluorescent material layer provided in the second depression of the substrate of the semiconductor light-emitting element, the second fluorescent material layer being excited by the light emitted from the semiconductor light-emitting element to emit light having a second wavelength longer than the first wavelength; and a third fluorescent material layer located in the first depression and provided between the side surface of the first depression and the semiconductor light-emitting element, the third fluorescent material layer being excited by the light emitted from the semiconductor light-emitting element to emit light having the second wavelength longer than the first wavelength.

18. The optical semiconductor device according claim 17, wherein the semiconductor light-emitting element emits blue light, the first fluorescent material layer emits yellow light, and the second and third fluorescent material layers emit red light.

19. The optical semiconductor device according to claim 17, wherein the second fluorescent material layer is bonded to the second depression of the substrate of the semiconductor light-emitting element with an adhesive material.

20. The optical semiconductor device according claim 17, wherein the second and third fluorescent material layers are formed apart from each other.

* * * * *